United States Patent
Ekinci et al.

(10) Patent No.: US 10,042,270 B2
(45) Date of Patent: Aug. 7, 2018

(54) IMAGING SYSTEM IN REFLECTION MODE USING COHERENT DIFFRACTION IMAGING METHODS AND USING MICRO-PINHOLE AND APERTURE SYSTEM

(71) Applicant: PAUL SCHERRER INSTITUT, Villigen PSI (CH)

(72) Inventors: Yasin Ekinci, Zurich (CH); Sangsul Lee, Untersiggenthal (CH)

(73) Assignee: Paul Scherrer Institut, Villigen PSI (CH)

( * ) Notice: Subject to any disclaimer, the term of this patent is extended or adjusted under 35 U.S.C. 154(b) by 36 days.

(21) Appl. No.: 15/120,231

(22) PCT Filed: Jan. 27, 2015

(86) PCT No.: PCT/EP2015/051583
§ 371 (c)(1),
(2) Date: Aug. 19, 2016

(87) PCT Pub. No.: WO2015/124386
PCT Pub. Date: Aug. 27, 2015

(65) Prior Publication Data
US 2017/0075231 A1    Mar. 16, 2017

(30) Foreign Application Priority Data

Feb. 21, 2014 (EP) ..................... 14156197

(51) Int. Cl.
*G03F 7/20* (2006.01)
*G03F 1/84* (2012.01)
*G03F 1/24* (2012.01)

(52) U.S. Cl.
CPC ............ *G03F 7/70641* (2013.01); *G03F 1/24* (2013.01); *G03F 1/84* (2013.01); *G03F 7/702* (2013.01);
(Continued)

(58) Field of Classification Search
CPC ... G03F 1/24; G03F 1/84; G03F 7/702; G03F 7/70641; G03F 7/7065; G03F 7/70666; G01N 2021/95676; G01N 21/956
See application file for complete search history.

(56) References Cited

U.S. PATENT DOCUMENTS 6,533,717 B2 * 3/2003 Silverman ........ A61B 17/12022
600/29
7,623,620 B2 * 11/2009 Mann ....................... G21K 7/00
359/368

(Continued)

FOREIGN PATENT DOCUMENTS

JP    2012531042 A    12/2012
JP    2013019793 A    1/2013

(Continued)

OTHER PUBLICATIONS

Lee, S., et al., "A novel concept for actinic EUV mask review tool using a scanning lensless imaging method at the Swiss Light Source", Proc. SPIE 9048, Extreme Ultraviolet (EUV) Lithography V, 904811 (Apr. 17, 2014).

(Continued)

*Primary Examiner* — Steven H Whitesell Gordon
(74) *Attorney, Agent, or Firm* — Laurence Greenberg; Werner Stemer; Ralph Locher

(57) ABSTRACT

A reflective sample, such as a mask, is imaged in an optics system. A radiation source emits a light beam with relatively low coherence. A first focusing element focuses the beam before a mirror reflects the focused beam towards the sample at an incidence angle of between 2 and 25° A pinhole aperture plate upstream of the sample has a first aperture to focus and cut-off the beam diameter to form a more monochromatic beam. The sample is displaced by a mechanism in a direction perpendicular to the normal vector of the sample surface while it reflects the light beam. The reflected beam (Continued)

passes a second aperture in the pinhole aperture plate next to the first aperture on its way to a pixel detector. The second aperture limits the diameter of the reflected beam, thereby adjusting the diameter of the light beam before it reaches the pixel detector.

11 Claims, 2 Drawing Sheets

(52) U.S. Cl.
CPC ........ *G03F 7/7065* (2013.01); *G03F 7/70666* (2013.01)

(56) References Cited

U.S. PATENT DOCUMENTS

| | | | |
|---|---|---|---|
| 7,821,714 B1 | 10/2010 | Lee et al. | |
| 8,711,346 B2 | 4/2014 | Stokowski | |
| 2003/0067598 A1* | 4/2003 | Tomie | G01N 21/95623 356/237.2 |
| 2004/0165165 A1* | 8/2004 | Yun | B82Y 10/00 355/53 |
| 2008/0078941 A1* | 4/2008 | Goodwin | G01N 21/95684 250/372 |
| 2011/0240863 A1* | 10/2011 | Lee | G01B 11/303 250/358.1 |
| 2012/0241645 A1* | 9/2012 | Yamaguchi | G01N 23/225 250/453.11 |
| 2013/0056642 A1* | 3/2013 | Lee | G03F 1/82 250/372 |
| 2013/0120820 A1* | 5/2013 | Krebs | G02B 26/0816 359/225.1 |

FOREIGN PATENT DOCUMENTS

| | | |
|---|---|---|
| KR | 2010013422 A | 12/2010 |
| KR | 20130044387 A | 5/2013 |

OTHER PUBLICATIONS

Harada, T., et al., "Imaging of extreme-ultraviolet mask patterns using coherent extreme-ultraviolet scatterometry microscope based on coherent diffraction imaging", Journal of Vacuum Science & Technology B, 29, 06F503 (2011), DOI:http://dx.doi.org/10.1116/1.3657525.

* cited by examiner

IMAGING SYSTEM IN REFLECTION MODE USING COHERENT DIFFRACTION IMAGING METHODS AND USING MICRO-PINHOLE AND APERTURE SYSTEM

BACKGROUND OF THE INVENTION

Field of the Invention

The present invention relates to a method and an apparatus in reflection mode using scanning coherent diffraction imaging methods and using micro-pinhole and aperture system.

The present invention has the scope to assist semiconductor manufacturers in the EUV range to detect defects in the mask pattern of the masks used to print EUV range structures in semiconductor business.

Current methods known to detect defects on semiconductor mask prior that these masks are used in the production of semiconductor chips are still very expensive and have rather low throughput.

BRIEF SUMMARY OF THE INVENTION

It is therefore the objective of the present invention to provide a system (apparatus) and a method for detecting defects of mask used in semiconductor chip production of the EUV range which are quiet simple and have a good throughput of the mask inspection.

This objective is achieved according to the present invention by An apparatus in reflection mode using scanning coherent diffraction imaging system for measuring an aerial image of a sample, i. e. a flat object which reflects light or has a Bragg diffraction, including photo masks for lithography at DUV, EUV, BEUV and X-rays, said apparatus comprising:
a) a radiation source, such as an EUV source, a DUV source, a BEUV or an X-ray source, that can have a relevant low temporal or spatial coherence to emit a light beam;
b) a first focusing element, such as a Fresnel plate or a toroidal mirror, in order to focus the emitted beam to the required extend;
c) a mirror that reflects the focused beam towards the sample to be analyzed; the beam being directed at an angle of 2 to 25°, preferably at an angle of about 6°, towards the sample as compared to the normal vector of the surface of the sample;
d) a pinhole aperture plate which allows with its first aperture to focus and cut-off the beam diameter to the desired extent thereby forming also the beam to become more monochromatic as compared to the beam as originally emitted from the light source;
e) a mechanism to displace the sample continuously or step-wise in a direction perpendicular to the normal vector of the sample surface to allow to analyze the sample which reflects the light beam that has passed the first aperture of the pinhole aperture plate disposed upstream of the sample under the same angle of the incident light, such as 6° for example with reference to the preferred example mentioned above;
f) said pinhole aperture plate having a second aperture allowing with its second aperture being disposed adjacent to the first aperture to limit the diameter of the beam reflected by the sample thereby adjusting the diameter of the light beam; and
g) a pixel detector to analyze the reflected beam that has passed the second aperture.

This setup allows to analyze the correctness of the pattern on the sample (mask) by using the scanning coherent diffraction method. In other words, by displacing the sample (mask) continuously or step-wise in the direction perpendicular to the normal vector of the surface of the sample, the differential course of the detected images can be analyzed to detect the deviations of the desired pattern as compared to the pattern of the actual pattern. Each time, the actual pattern comprises a defect in its pattern, the differential images of the reflected beams will deviate from an expected behavior. Thus, these deviations reflect the "image errors" caused by the defects in the pattern of the sample (mask).

In a further preferred embodiment of the present invention, the apparatus further comprises a computing unit adapted to reconstruct an aerial image of the sample, preferably including three-dimensional tomographic image related penetration effect of the beam in the reflection mode.

In order to improve the coherence of the light beam the apparatus may further comprises a compositing transparent zone plate, a reflected multilayer mirror, the pinhole aperture plate and its apertures using the thin membrane lithography techniques to provide coherent light.

Further, the coherence can be improved when the apparatus can adjust the monochromatic coherent beam by the combinations of the optical system, an order sorting aperture and the pinhole aperture plate wherein the first apertures and the second apertures as transparent window are made by nanometer thick membrane.

Preferably, the second aperture (transparent window) is adapted to pass the 1 order diffracted beam to the pixel detector.

A further preferred embodiment can be achieved when the reflected multilayer mirror is a composed flat mirror or a curved mirror, being disposed upstream or downstream of the pinhole aperture plate.

Another option to improve the coherence of the light beam provides for an apparatus that controls both coherent element and magnification of the light beam by a combination of the focusing element, the transparent window and the pinhole aperture plate.

The zeroth order light beam might have a disturbing effect on the quality of the evaluation of the light beams reflected by the sample, wherein the second aperture of the micro pinhole plate comprises an attenuation element in order to attenuate the zeroth order of the reflected beam to a predetermined extent.

BRIEF DESCRIPTION OF THE SEVERAL VIEWS OF THE DRAWING

Preferred examples of the present invention are hereinafter explained in more detail with reference to the attached drawings which depict in.

DESCRIPTION OF THE INVENTION

Figure 1:
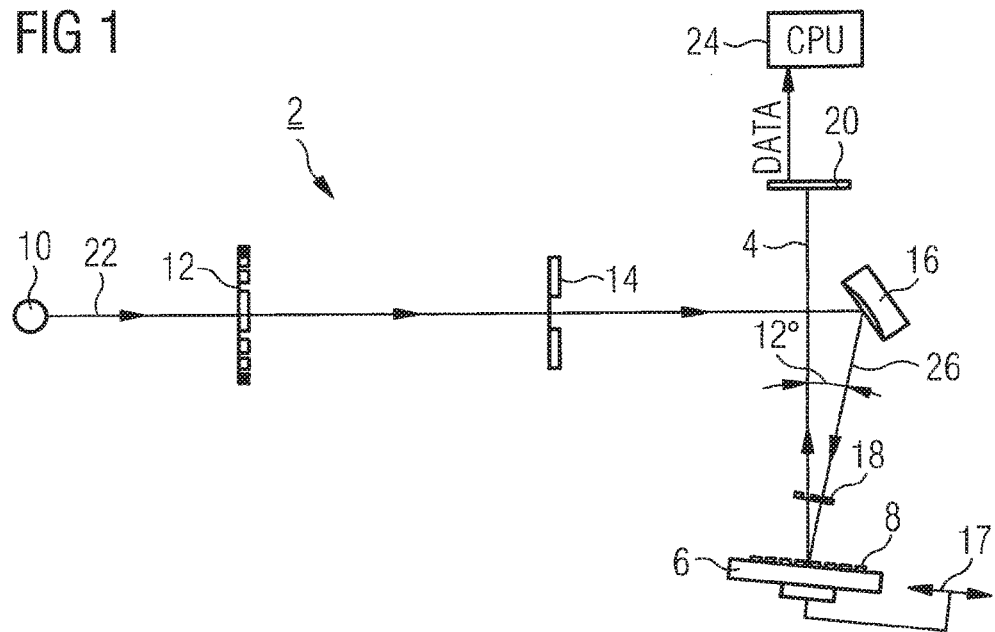
FIG. 1 schematically the optical setup of an apparatus to analyze a beam being reflected by a sample for detecting defects in the pattern of the sample.

FIG. 1 shows schematically the optical setup of an apparatus 2 to analyze a light beam 4 being reflected by a sample 6 for detecting defects in the pattern 8 of the sample 6. Said apparatus 2 comprises:

a) a light source 10, such as a EUV source, a BUV source, a BEUV source or an X-ray source;
b) a diffractive focusing element 12, like a Fresnel zone plate or a toroidal mirror with or without gratings on it;
c) an order sorting aperture 14 (optional element);
d) a reflective mirror 16 (flat or curved);
e) the sample 6 which can be for example a mask having pattern to be analyzed wherein the sample 6 is supported by a mechanism 17 that can move the sample stepwise or continuously in a direction perpendicular to the normal vector of the surface of the sample 6;
f) a pinhole-aperture unit 18; and
g) a pixel detector 20.

Figure 2:
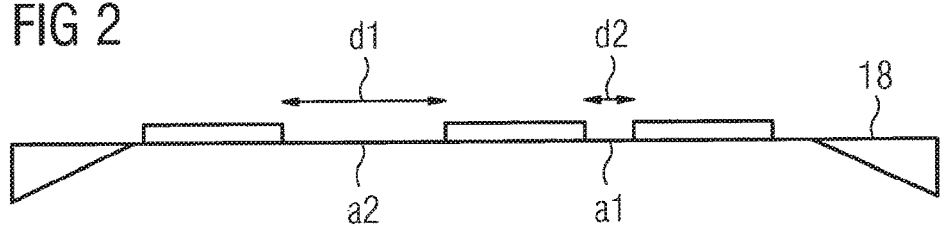
FIG. 2 schematically and in more detail a pinhole aperture plate as used in the optical setup of the apparatus of FIG. 1.

FIG. 2 shows in more detail the pinhole-aperture unit 18 on a transparent substrate or thin film comprising a first aperture a1 having a diameter d1 and a second aperture a2 having a diameter d2.

The invention comprises the apparatus 2 as shown in FIG. 1 for measuring an aerial image of the sample 6 to be analyzed, wherein the sample is for example a flat object, such as a mask, comprising the surficial pattern 8 which reflects light or has a Bragg diffraction. Typical samples in this set-up are photo masks for lithography at DUV, EUV, BEUV and X-rays. The apparatus 2 uses the pinhole aperture plate 18 as detailed shown in FIG. 2.

The apparatus 2 and the method of imaging the mask pattern and analyze the mask pattern for defects comprises to scan the sample 6 by moving the sample 6 with the mechanism 17 in a direction as indicated by an arrow and analyze the images reflected by the pattern 8 of the sample 6. The light source 10, for example an EUV Source, generates a light beam 22 that is a focused beam being at least partially coherence at a different angle on the scanning position on the sample 6. The incident beam comes in this specific example under an angle of about 6° as compared to the normal vector of the surface of the sample 6. The reflected beam leaves the sample 6 therefore under an angle of about 6°, too. Therefore, the angle between the incident beam and the reflected beam is about 12°. In general, the angle of the incident beam is not limited to 6°. The angle rather depends on the set-up and/or the wavelength chosen. In other embodiment, the angle could therefore also be 5° or 8° or 15°. In general, an angle in the range from 2° to 35° appears to be reasonable depending on the circumstances.

The apparatus as shown in FIG. 1 further includes a computing unit 24 that is associated with the pixel detector 20 and that is adapted to reconstruct an aerial image of the sample including three-dimensional tomographic image related penetration effect of the beam in the reflection mode.

The apparatus 2 comprises the light source 10 to exposure the light beam 22. The exposing of the sample (mask) with light is performed to obtain an aerial image of the sample, wherein the optics system makes proper coherence (temporal and spatial) to scan the reflected sample with tunable incident beam properties. This proper coherence is to a substantial extent formed with the pinhole aperture plate 18 which in particular forms with its first aperture a1 a more monochromatic beam as compared to the initial beam 22 generated by the light source 10. The first aperture a1 having the diameter d1 and the second aperture a2 having a diameter d2 therefore guarantees that the scanning of the pattern 8 of the sample 6 (mask) is performed under actinic conditions.

Preferably, the apparatus 2 comprises as shown in FIG. 1 the focusing transparent zone plate 12, such as a Fresnel zone plate or a toroidal mirror, the reflection multilayer mirror 16, the micro-pinhole aperture plate 18; all components using the thin membrane lithography techniques to provide a coherent light beam 26 to the surface of the sample 6.

Preferably, the apparatus 2 can be adjusted to provide the monochromatic coherent beam 26 by the proper combinations of the optical system, thereby choosing the order sorting aperture and the micro-pinhole plate 18 which comprises the pinhole (first aperture a1) and the transparent window (second aperture d2) under the desired circumstances. For example, the diameter of the incident light beam 26 illuminated a spot on the mask having a diameter of about 1 to 10 μm and the distance between the mask and the pinhole plate can be in the range of 0.1 to 10 mm. Both, the order sorting aperture and the micro-pinhole plate can be made by nanometer thick membrane.

Additionally, the transparent window (second aperture a2) can be adapted to let pass the first order diffracted beam to the pixel detector 20 wherein the micro-pinhole plate 18 guarantees both the coherence and transmittance of incident beam and the reflected beam.

Optionally, the reflected multilayer mirror 16 is composed of a flat mirror or a curved mirror. The mirror itself can be disposed upstream (as shown in FIG. 1) or downstream of the pinhole-aperture plate 18.

Further, the micro-pinhole plate 18 may control both the coherence of the light beam 26 and the magnification according to the combination of this optical part of the apparatus together with a focusing component, order sorting aperture and the pinhole, here the first aperture a1.

Figure 3:
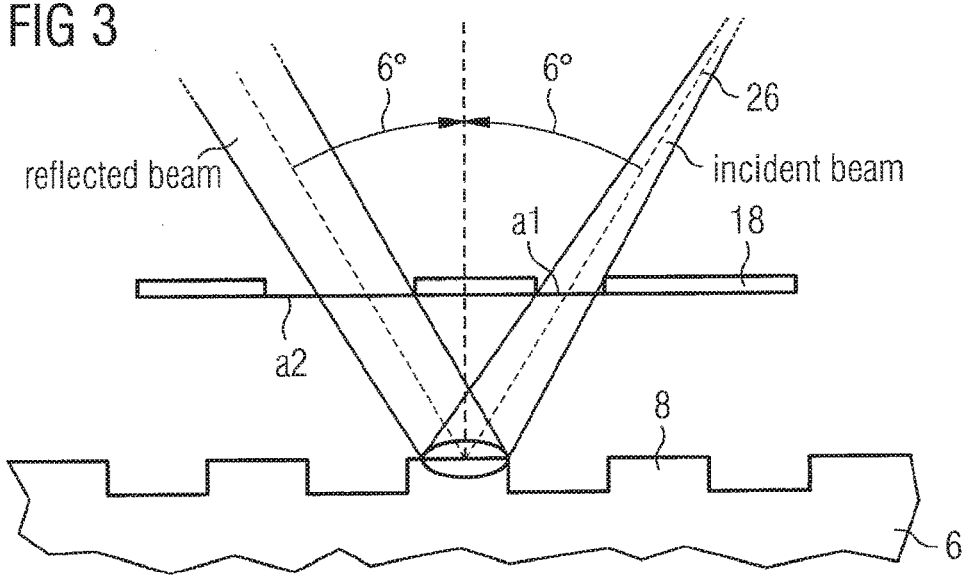
FIG. 3 schematically and in more detail the course of the incident beam and the reflected beam of the optical setup.
Figure 4:
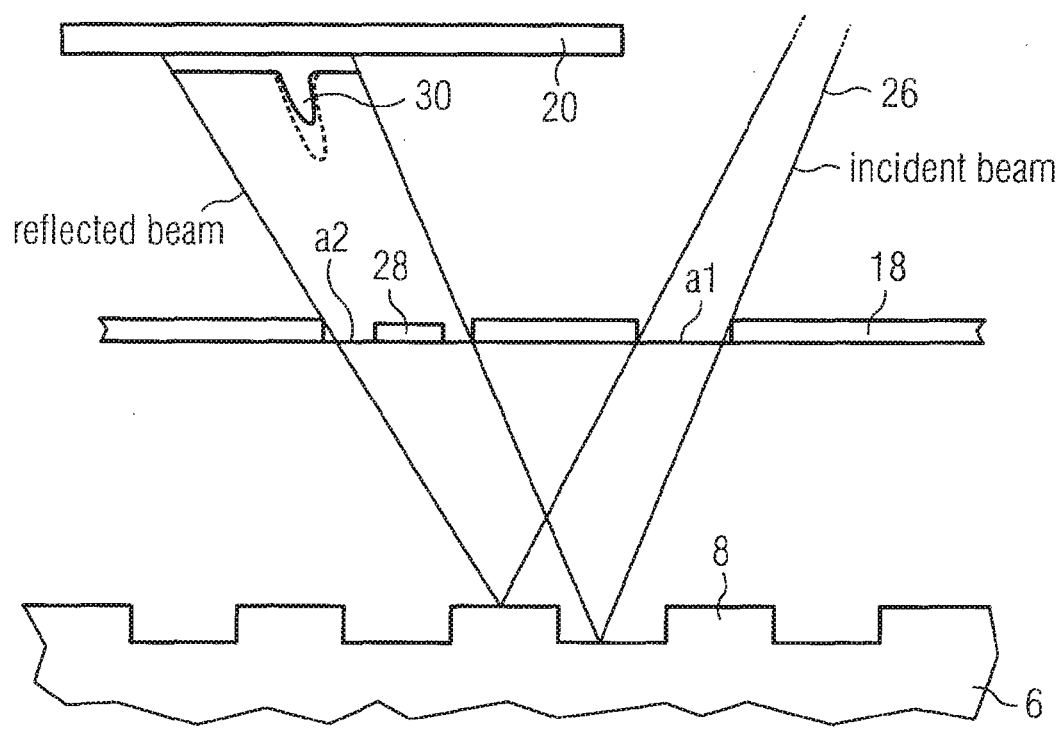
FIG. 4 schematically and in more detail the course of the incident beam and the reflected beam wherein an aperture in the pinhole aperture plate for the reflected beam comprises an attenuation element for attenuating the zeroth order of the reflected beam.

FIGS. 3 and 4 show in more detail the course of the incident beam and the reflected beam relative to the pinhole aperture plate 18. As it can be seen from FIG. 3, the first aperture a1 limits the diameter of the light beam that is downwards of the pinhole plate 18 reflected by the surficial structure (pattern 8) of the sample 6. By this spatial limitation, the temporal coherence of the incident beam 26 to be reflected by the sample 6 is significantly increased since the first aperture a1 cuts off the components of the beam having a different orientation due to their respective diffraction being caused by the comparably large wavelength distribution of the initial beam 22 emitted by the light source 10 (which therefore can be to a certain extent a broadband source). The width of the second aperture can then be chosen to cut-off the part of the reflected beam which does not match the dimension of the sensitive area of the pixel detector 20.

FIG. 4 shows schematically and in more detail the course of the incident beam and the reflected beam wherein the second aperture a2 in the pinhole aperture plate (e) provided for the reflected beam comprises an attenuation element 28 for attenuating the zeroth order of the reflected beam. This attenuation helps to render the pixel detector 20 more sensitive for the detection of the first and further orders of the reflected beam. This is illustrated by a smaller wavefront 30 on the surface of the detector 20 as compared to the not attenuated wave front.

The invention claimed is:

1. An apparatus in reflection mode using scanning coherent diffraction imaging system for measuring an areal image of a sample, the apparatus comprising:

a) a radiation source configured to emit a light beam;
b) a first focusing element disposed to focus the light beam emitted by said radiation source and to form a focused beam;
c) a mirror disposed to reflect the focused beam towards the sample to be analyzed; the beam being directed at an angle of 2 to 25° towards the sample relative to a normal vector of a surface of the sample;
d) a pinhole aperture plate having a first aperture focusing and cutting off a beam diameter to a desired extent, thereby rendering the beam more monochromatic as compared to the light beam as originally emitted from said light source;
e) a mechanism configured to displace the sample continuously or step-wise in a direction perpendicular to the normal vector of the surface of the sample for analyzing the sample which reflects the light beam after having passed said first aperture of said pinhole aperture plate disposed upstream of the sample in a propagation direction of the light beam at an angle corresponding to the angle of the incident light;
f) said pinhole aperture plate having a second aperture being a transparent window adjacent said first aperture, said second aperture being disposed to limit a diameter of the light beam reflected by the sample to thereby adjust the diameter of the reflected light beam;
g) a pixel detector disposed to analyze the reflected light beam after having passed the second aperture ; and
h) computing unit configured to reconstruct an areal image of the sample, said computing unit being configured to reconstruct a three-dimensional tomographic image related penetration effect of the beam in the reflection mode.

2. The apparatus according to claim 1, wherein the sample is a flat object which reflects light or has a Bragg diffraction.

3. The apparatus according to claim 1, wherein the sample is a photo mask for lithography at DUV, EUV, BEUV and X-rays, and said a radiation source is an EUV source, a DUV source, a BEUV or an X-ray source, and the light beam emitted by said radiation source has a relatively low temporal or spatial coherence.

4. The apparatus according to claim 1, wherein said first focusing element is a Fresnel plate or a toroidal mirror.

5. The apparatus according to claim 1, wherein said mirror is disposed to direct the focused beam towards the sample at an angle of about 6° relative to the normal vector of the surface of the sample, and the sample reflects the light beam at an angle of about 6° relative to the normal vector.

6. The apparatus according to claim 1, further comprising a compositing transparent zone plate, a reflected multilayer mirror, said pinhole aperture plate and said first and second apertures using thin membrane lithography techniques to provide coherent light.

7. The apparatus according to claim 1, configured to control a coherence and a magnification of the light beam by a combination of said focusing element, said transparent window, and said pinhole aperture plate.

8. An apparatus in reflection mode using scanning coherent diffraction imaging system for measuring an areal image of a sample, the apparatus comprising:
a) a radiation source configured to emit a light beam;
b) a first focusing element disposed to focus the light beam emitted by said radiation source and to form a focused beam;
c) a mirror disposed to reflect the focused beam towards the sample to be analyzed; the beam being directed at an angle of 2 to 25° towards the sample relative to a normal vector of a surface of the sample;
d) a pinhole aperture plate having a first aperture focusing and cutting off a beam diameter to a desired extent, thereby rendering the beam more monochromatic as compared to the light beam as originally emitted from said light source;
e) a mechanism configured to displace the sample continuously or step-wise in a direction perpendicular to the normal vector of the surface of the sample for analyzing the sample which reflects the light beam after having passed said first aperture of said pinhole aperture plate disposed upstream of the sample in a propagation direction of the light beam at an angle corresponding to the angle of the incident light;
f) said pinhole aperture plate having a second aperture being a transparent window adjacent said first aperture, said second aperture being disposed to limit a diameter of the light beam reflected by the sample to thereby adjust the diameter of the reflected light beam; and
g) a pixel detector disposed to analyze the reflected light beam after having passed the second aperture, and configured to further adjust the monochromatic coherent beam by combinations of an optical system, an order sorting aperture and said pinhole aperture plate, wherein said first aperture and said second apertures being said transparent window are made by a nanometer thick membrane.

9. The apparatus according to claim 8, wherein said transparent window is configured to pass the 1st order diffracted beam to said pixel detector.

10. An apparatus in reflection mode using scanning coherent diffraction imaging system for measuring an areal image of a sample, the apparatus comprising:
a) a radiation source configured to emit a light beam;
b) a first focusing element disposed to focus the light beam emitted by said radiation source and to form a focused beam;
c) a mirror disposed to reflect the focused beam towards the sample to be analyzed; the beam being directed at an angle of 2 to 25° towards the sample relative to a normal vector of a surface of the sample;
d) a pinhole aperture plate having a first aperture focusing and cutting off a beam diameter to a desired extent, thereby rendering the beam more monochromatic as compared to the light beam as originally emitted from said light source;
e) a mechanism configured to displace the sample continuously or step-wise in a direction perpendicular to the normal vector of the surface of the sample for analyzing the sample which reflects the light beam after having passed said first aperture of said pinhole aperture plate disposed upstream of the sample in a propagation direction of the light beam at an angle corresponding to the angle of the incident light;
f) said pinhole aperture plate having a second aperture being a transparent window adjacent said first aperture, said second aperture being disposed to limit a diameter of the light beam reflected by the sample to thereby adjust the diameter of the reflected light beam;
g) a pixel detector disposed to analyze the reflected light beam after having passed the second aperture;
h) a compositing transparent zone plate, a reflected multilayer mirror, said pinhole aperture plate and said first and second apertures using thin membrane lithography techniques to provide coherent light, wherein said reflected multilayer mirror is a composed flat mirror or a curved mirror disposed upstream or downstream of the pinhole aperture plate in the light beam propagation direction.

11. An apparatus in reflection mode using scanning coherent diffraction imaging system for measuring an areal image of a sample, the apparatus comprising:

a) a radiation source configured to emit a light beam;

b) a first focusing element disposed to focus the light beam emitted by said radiation source and to form a focused beam;

c) a mirror disposed to reflect the focused beam towards the sample to be analyzed; the beam being directed at an angle of 2 to 25° towards the sample relative to a normal vector of a surface of the sample;

d) a pinhole aperture plate having a first aperture focusing and cutting off a beam diameter to a desired extent, thereby rendering the beam more monochromatic as compared to the light beam as originally emitted from said light source;

e) a mechanism configured to displace the sample continuously or step-wise in a direction perpendicular to the normal vector of the surface of the sample for analyzing the sample which reflects the light beam after having passed said first aperture of said pinhole aperture plate disposed upstream of the sample in a propagation direction of the light beam at an angle corresponding to the angle of the incident light;

f) said pinhole aperture plate having a second aperture being a transparent window adjacent said first aperture, said second aperture being disposed to limit a diameter of the light beam reflected by the sample to thereby adjust the diameter of the reflected light beam; and g) a pixel detector disposed to analyze the reflected light beam after having passed the second aperture, and wherein said second aperture of said pinhole aperture plate comprises an attenuation element configured to attenuate a zeroth order of the reflected light beam to a predetermined extent.

* * * * *